US006889841B2

(12) United States Patent
Maccoux et al.

(10) Patent No.: US 6,889,841 B2
(45) Date of Patent: May 10, 2005

(54) INTERFACE APPARATUS FOR RECEPTION AND DELIVERY OF AN INTEGRATED CIRCUIT PACKAGE FROM ONE LOCATION TO ANOTHER

(75) Inventors: Daniel A. Maccoux, Brooklyn Park, MN (US); Brian K. Warwick, Ben Lomond, CA (US)

(73) Assignee: JohnsTech International Corporation, Minneapolis, MN (US)

( * ) Notice: Subject to any disclaimer, the term of this patent is extended or adjusted under 35 U.S.C. 154(b) by 35 days.

(21) Appl. No.: 10/189,909

(22) Filed: Jul. 3, 2002

(65) Prior Publication Data

US 2004/0005812 A1 Jan. 8, 2004

Related U.S. Application Data

(60) Provisional application No. 60/303,003, filed on Jul. 3, 2001.

(51) Int. Cl.[7] .............................................. B65D 85/90
(52) U.S. Cl. ........................ 206/724; 206/722; 324/755
(58) Field of Search ................................ 206/722, 701, 206/710, 711, 714, 719, 724, 725; 439/72, 73, 78, 525; 29/25.01; 324/754, 755, 758

(56) References Cited

U.S. PATENT DOCUMENTS

| 5,172,049 A | * | 12/1992 | Kiyokawa et al. | 324/760 |
| 5,208,529 A | * | 5/1993 | Tsurishima et al. | 324/754 |
| 5,301,416 A | * | 4/1994 | Foerstel | 29/593 |
| 5,557,212 A | * | 9/1996 | Isaac et al. | 324/755 |
| 5,920,192 A | * | 7/1999 | Kiyokawa | 324/158.1 |
| 5,926,027 A | * | 7/1999 | Bumb et al. | 324/755 |
| 6,019,612 A | * | 2/2000 | Hasegawa et al. | 439/73 |
| 6,104,204 A | * | 8/2000 | Hayama et al. | 324/760 |

* cited by examiner

Primary Examiner—Jim Foster
(74) Attorney, Agent, or Firm—Nawrocki, Rooney & Sivertson, P.A.

(57) ABSTRACT

An interface apparatus for reception and delivery of a package from a first location to a second location. The apparatus comprises a nest assembly having an interior defining a nest for receiving a package. The nest is formed by a plurality of sidewalls each having an interior surface, an exterior surface, and an end surface extending between the interior and exterior surfaces. In one embodiment, the interface between the interior surface and the end surface is constructed and arranged having at least a portion of the interface surface substantially conforming to the shape of the angled portion of the leads.

1 Claim, 21 Drawing Sheets

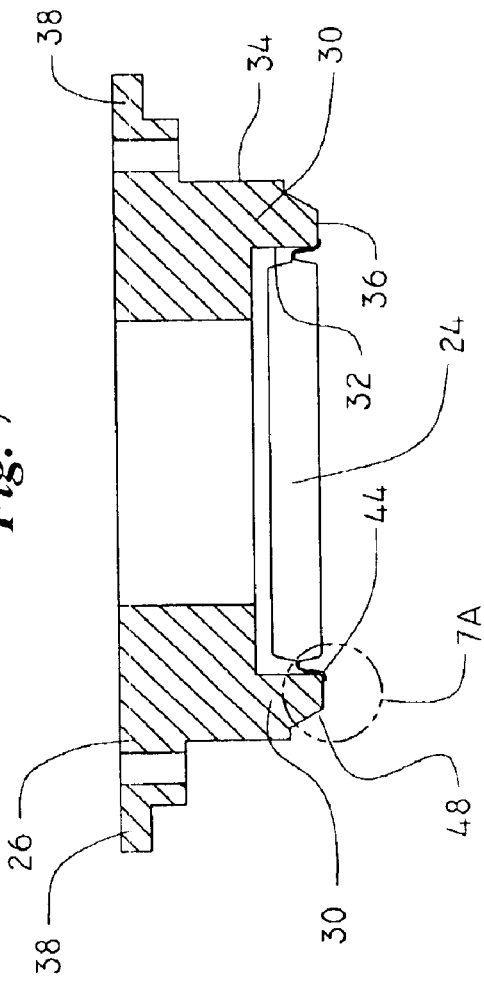
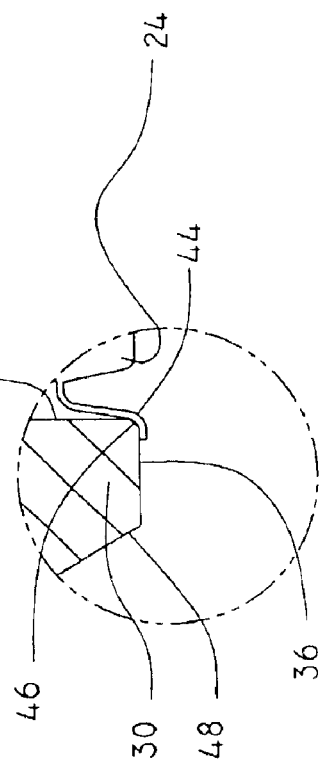

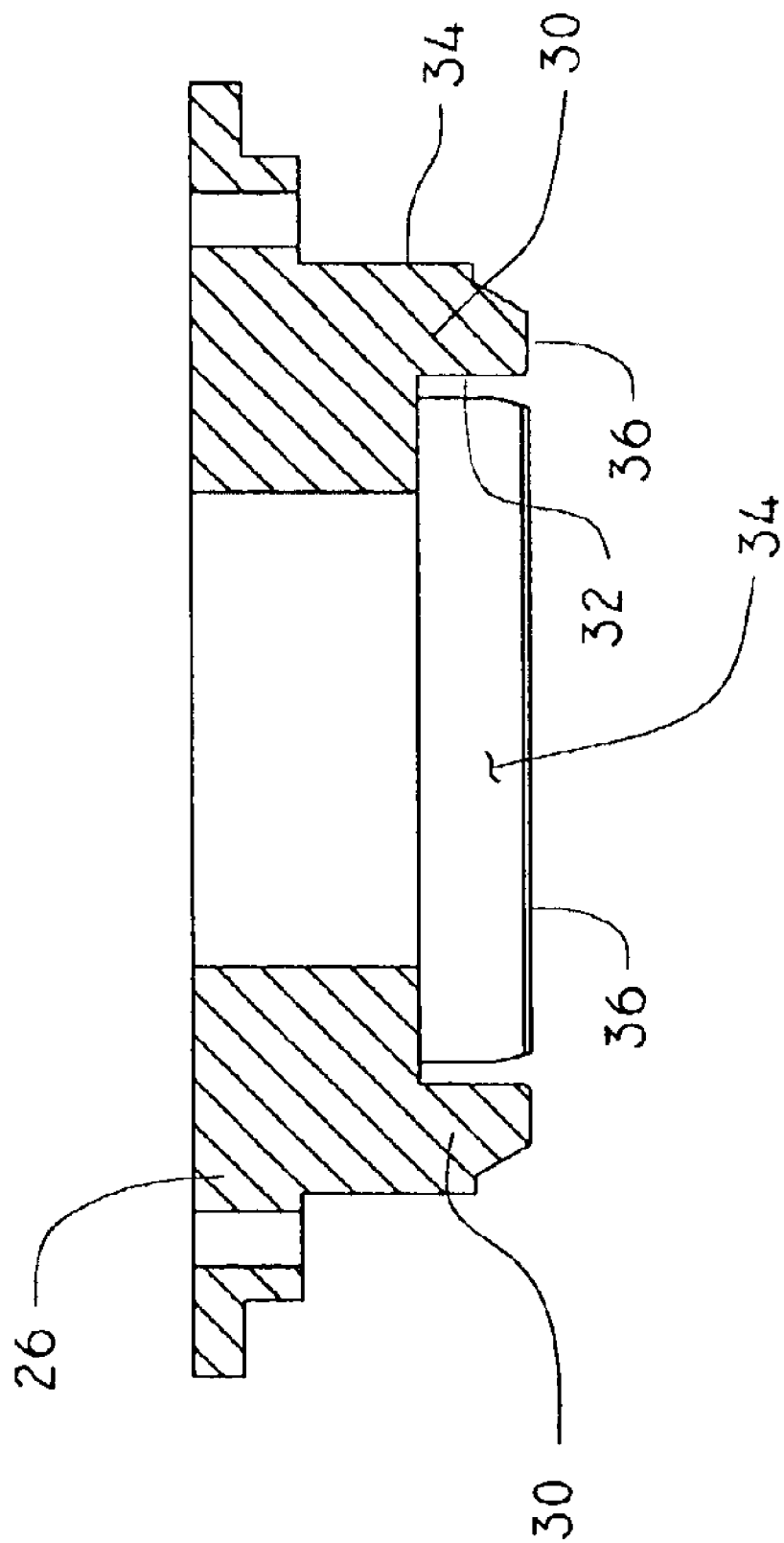

INTERFACE APPARATUS FOR RECEPTION AND DELIVERY OF AN INTEGRATED CIRCUIT PACKAGE FROM ONE LOCATION TO ANOTHER

This application claims the benefit of Provisional Application Ser. No. 60/303,003, filed Jul. 3, 2001.

BACKGROUND OF THE INVENTION

The present invention generally relates to apparatus for automated handling of integrated circuit packages. More particularly, it relates to an interface apparatus for reception and delivery of an integrated circuit package (IC package) from one location to another. Due in part to the increase in the speed of processes involved in manufacturing and testing of IC packages, the accuracy of movement and placement of IC packages has become more important.

For example, the testing of integrated circuit packages has become a largely automated process wherein an IC package is taken from a supply line that contains a plurality of IC packages that are awaiting a test, and places each package in a test socket for testing. A commonly employed method and apparatus for moving and testing an integrated circuit package (hereinafter package) utilizes an automated pick and place handler in combination with a test socket. The handler is generally a mechanical arm having a nest assembly mounted to the end of the arm. The nest assembly has a recess or cavity designed to hold an IC package. The handler takes a package that is resting in a supply structure, often called a boat, and moves the nest assembly into position to receive the package in the nest. The package is then removed from the boat and held in the nest assembly, allowing the package to be transported and positioned to deliver the package to a test socket for testing.

There exist a number of problems with traditional pick and place units utilized for testing and the like. These problems generally relate to alignment of the package within the nest assembly and its subsequent delivery. If the package is misaligned, the package may be damaged by contacting the surfaces of the boat, the nest assembly, and/or a receiving location, such as a test socket, while positioned incorrectly or while being moved. Further, the design of traditional nest assemblies, supply structures, and receiving locations are merely designed to hold the package and are not designed to properly engage the package such that it is aligned correctly.

The present invention addresses these needs, as well as other problems associated with the prior art. The present invention offers advantages over the prior art and solves problems associated therewith.

SUMMARY OF THE INVENTION

The present invention provides an apparatus for receiving a package into a nest assembly and delivering the package to, and in alignment with, a receiving location. The assembly includes any apparatus for repeatedly receiving devices from a first location and aligning with and placing the devices at a second location. The apparatus may also deliver devices back to the original location or to a third location. The assembly may utilize all new components or may utilize an existing handler and may use an existing supply structure or a modified supply structure, a modified nest assembly, and/or a modified receiving location. Additionally, one or more features of the present invention may be utilized with any type of IC package whether the package has leads or not. For example, the features of the present invention may be utilized with BGA, MLF, MLP, LGA devices, and the like.

The present invention comprises an interface apparatus for reception and delivery of a package, having leads that are at least partially angled outward with respect to the center of the package, from a first location to a second location. The apparatus comprises a nest assembly having a nest, defining an interior, for receiving a package. The nest is formed by a plurality of sidewalls each having an interior surface, an exterior surface, and an end surface extending between the interior and exterior surfaces. The interface between the interior surface and the end surface is constructed and arranged having at least a portion of the interface surface substantially conforming to the shape of the angled portion of the leads. The conforming surfaces may include surfaces such as curved surfaces, angled planar surfaces, and other such conforming surface designs.

The present invention also provides an interface system having a nest assembly apparatus with a means for retaining temperature of the package in order to retain its temperature prior to, during, and/or after a test. In one embodiment, the nest of the nest assembly is at least partially formed from a temperature conductive material. The portion formed from this material is preferably adjacent to or abutted against the surface of the package. In another embodiment, a temperature conductive portion is mounted to the nest by a plurality of resilient mechanisms. It is preferred that the force applied by the resilient mechanisms be sufficient to keep the surface of the conductive material in contact with the package, but not large enough to provide the primary force to press the package into the test socket. Any number and suitable type of resilient mechanisms, may be utilized, including elastomeric materials and mechanical structures, such as springs and the like.

Additionally, the present invention provides an interface system for reception and delivery of a package from a first location to a second location, wherein the supply structure has a recessed interior defined by a plurality of sidewalls. The nest assembly also has a plurality of sidewalls thereon that each have an interior surface, an exterior surface, and an end surface extending between the interior and exterior surfaces. The interface between the exterior surface and the end surface of the nest assembly, and/or of the supply structure, is constructed and arranged to guide the sidewalls of the nest assembly into the recessed interior of the supply structure. One such structure provides that each sidewall of the supply structure has at least an interior surface, and that the interior surface is angled outward from the interior, and at least a portion of the interface between the exterior and interior surfaces of the nest assembly is angled outward from the end surface. It is preferred that the interface between the exterior surface and the end surface of the nest assembly is oppositely angled with respect to the angle of a sidewall of the supply structure.

The present invention also provides an interface system for reception and delivery of a package from a first location to a second location, wherein the nest assembly has a retainer and a nest. The retainer has an aperture formed therein and the nest has means for retaining a portion of the nest within the aperture. The nest preferably has a top portion, wherein the means for retaining is provided by a flange extending outward from the mounting portion. Additionally, the flange preferably extends laterally around the entirety of the mounting portion. In one embodiment, the retainer has a mounting surface and the flange is received in a recess formed in the mounting surface of the retainer. In another embodiment, the flange has a perimeter and the aperture has a perimeter. The perimeter of the flange is larger than the perimeter of the aperture. Preferably, the nest is received within the retainer such that the mounting surfaces of the nest and the retainer are flush with each other. In yet another embodiment, the nest has a mounting surface with a perimeter, the retainer has a mounting surface wherein the aperture of the retainer has a perimeter at the mounting surface. The perimeter of the aperture is larger than the perimeter of the nest, such that a gap is created between the nest and the retainer. Preferably, a gap is created along all sides of the perimeter of the mounting surface of the nest. This feature allows the nest to "float" or be X and/or Y axis compliant (e.g. move generally with the two elongate dimensions of the retainer) with respect to the retainer. The nest may also be able to twist in the X-Y plane. This twisting is generally referred to as theta rotation.

The present invention also provides an interface system for reception and delivery of a package from a first location to a second location, wherein a receiving structure has a recessed interior that is defined by a plurality of sidewalls and a nest assembly that has a plurality of sidewalls thereon, that each sidewall has an interior surface, an exterior surface, and an end surface extending between the interior and exterior surfaces. The interface between the exterior surface and the end surface of the nest assembly is constructed and arranged to guide the sidewalls of the nest assembly into the recessed interior of the receiving structure. In one embodiment, each sidewall of the receiving structure has at least an interior surface. The interior surface is angled outward from the interior, and at least a portion of the interface between the exterior and end surfaces is angled outward from the end surface. Preferably, the interface between the exterior surface and the end surface of the nest assembly is oppositely angled with respect to the angle of a sidewall of the supply structure.

The present invention also provides an interface system for reception and delivery of a package from a first location to a second location, wherein a nest assembly is constructed and arranged to carry a package. A receiving structure is constructed and arranged for receiving a package from a nest assembly. The receiving structure has means for restricting over travel of the nest assembly as it is positioned to deliver a package. In one embodiment, the receiving structure has a top surface and the means for restricting over travel is provided by at least one over travel structure mounted to the top surface of the receiving structure. In another embodiment, the nest assembly has an upper surface and a lower surface and at least one of the over travel structures has a top surface. In this embodiment, the lower surface of the nest assembly is constructed and arranged to contact the top surface of the over travel structure. In the embodiments above, the over travel structure may be fixed or removable and the height of the over travel structure may be fixed or adjustable.

The present invention also provides an interface system for reception and delivery of a package, having a plurality of leads aligned along at least one side of the package, from a first location to a second location wherein a nest assembly has an interior defining a nest for receiving a package. The nest is formed by a plurality of sidewalls each having an interior surface, an exterior surface, and an end surface extending between the interior and exterior surfaces. The end surface is constructed and arranged to support the leads thereon and to extend beyond the ends of the aligned plurality of leads.

The present invention also provides an interface system for reception and delivery of a package from a first location to a second location, having an alignment plate constructed and arranged to be received on a receiving structure. The alignment plate has means for aligning a nest assembly with the receiving structure. The alignment plate may also comprise a spring mechanism for cushioning the engagement between the nest assembly and the receiving structure. Additionally, the alignment plate may also include an over travel stop mechanism for restricting the movement of the nest assembly.

The present invention also provides a spring mechanism for an interface system for reception and delivery of a package from a first location to a second location. The spring assembly has a means for providing a resilient force between two objects and means for restricting the movement of the assembly and thereby restricting the distance between the objects at both a minimum distance and a maximum distance. The spring mechanism may utilize a coil spring with a minimum restricting structure and a maximum restricting structure. Additionally, the spring mechanism may utilize a cylinder having a hollow interior, and the means for providing force between two objects may be positioned within the hollow interior, and be utilized with a minimum restricting structure and a maximum restricting structure. Furthermore, the spring mechanism may utilize a cylinder, having a hollow interior, and a top, with the means for providing force between two objects being positioned within the hollow interior and between a bottom surface of the cylinder and the top, and be utilized with a minimum restricting structure and a maximum restricting structure.

The above mentioned benefits and other benefits of the invention will become clear from the following description by reference to the accompanying drawings.

DESCRIPTION OF THE DRAWINGS

FIG. 7 illustrates an embodiment of the present invention showing a nest, with an IC package positioned therein;

FIG. 7a illustrates a close up view 7A of FIG. 7;

FIG. 10 illustrates a side view of an embodiment of the present invention showing a nest.

DESCRIPTION OF THE PREFERRED EMBODIMENT

The present invention provides an interface apparatus generally comprising a nest assembly, utilizing an existing supply structure, and a receiving structure and provides embodiments that allow for improved one, two, or three dimensional alignment as well as theta rotation between the nest assembly and the receiving structure, such as a test socket, and a supply structure. The basic structure for which the present invention is best utilized is in a pick and place handling process for the reception and delivery of a package from a first location to a second location. The parts of the present invention may be utilized individually or as a system for transport and testing packages. Additionally, the present invention may be designed to utilize the disclosed alignment techniques in any of one or more dimensions.

Figure 1:
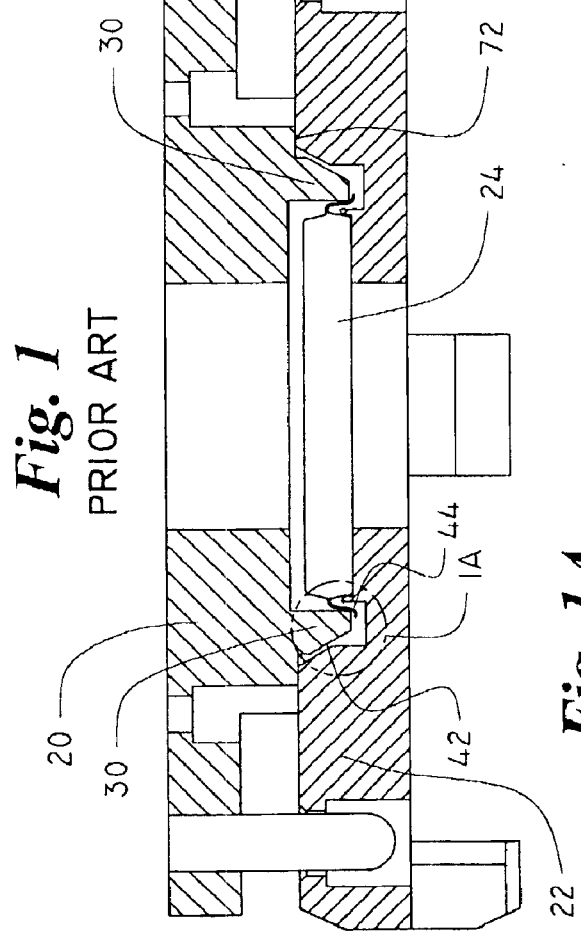
FIG. 1 illustrates a prior art device showing the interaction between a nest, supply structure, and a package.
Figure 1A:
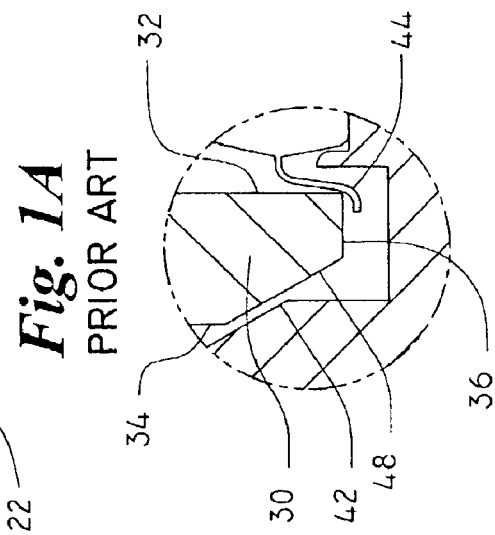
FIG. 1a illustrates a close up view 1A of FIG. 1.

The nest assembly 20, particularly shown in FIG. 1, is most typically fitted to the end of a mechanical arm, that is positioned to receive a package 24 from a supply structure 22, such as a boat, and deliver the package to a receiving structure 50, such as a test socket. In some embodiments of the present invention, the nest assembly 20 is generally comprised of two parts: a nest 26 and a retainer 28.

The nest 26 generally has a body with a plurality of receiving sidewall members 30, extending outward therefrom, forming at least a portion of the boundary of a recessed area for receiving a package 24. The sidewalls 30 generally have an interior surface 32, an exterior surface 34, and an end surface 36 extending between the interior and exterior surfaces. The sidewalls 30 of the nest 26 may be of any suitable dimensions or shapes such that they may be utilized with any known package designs. Preferably, the lengths L of the sidewalls 30 should be larger than the length Lc of the portion of the package covered by contacts. In this way, all leads are supported and protected by a sidewall.

Figure 3:
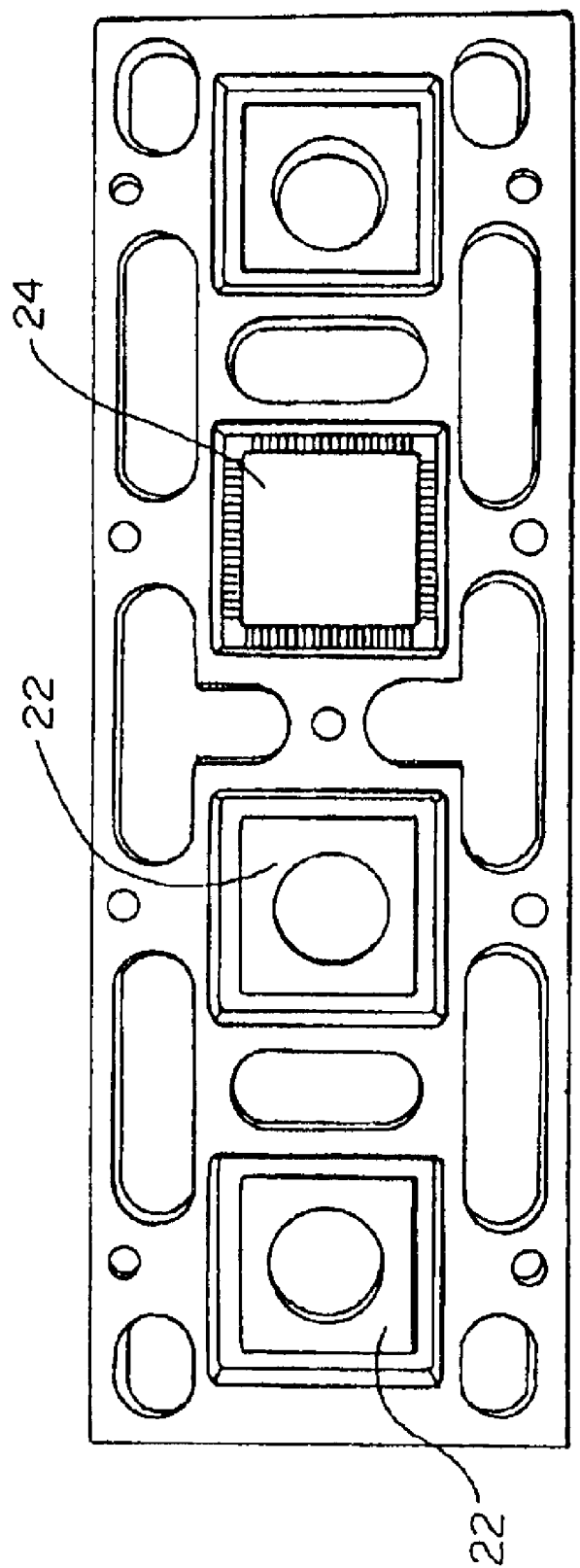
FIG. 3 illustrates the interaction between a supply structure and a package.
Figure 4:
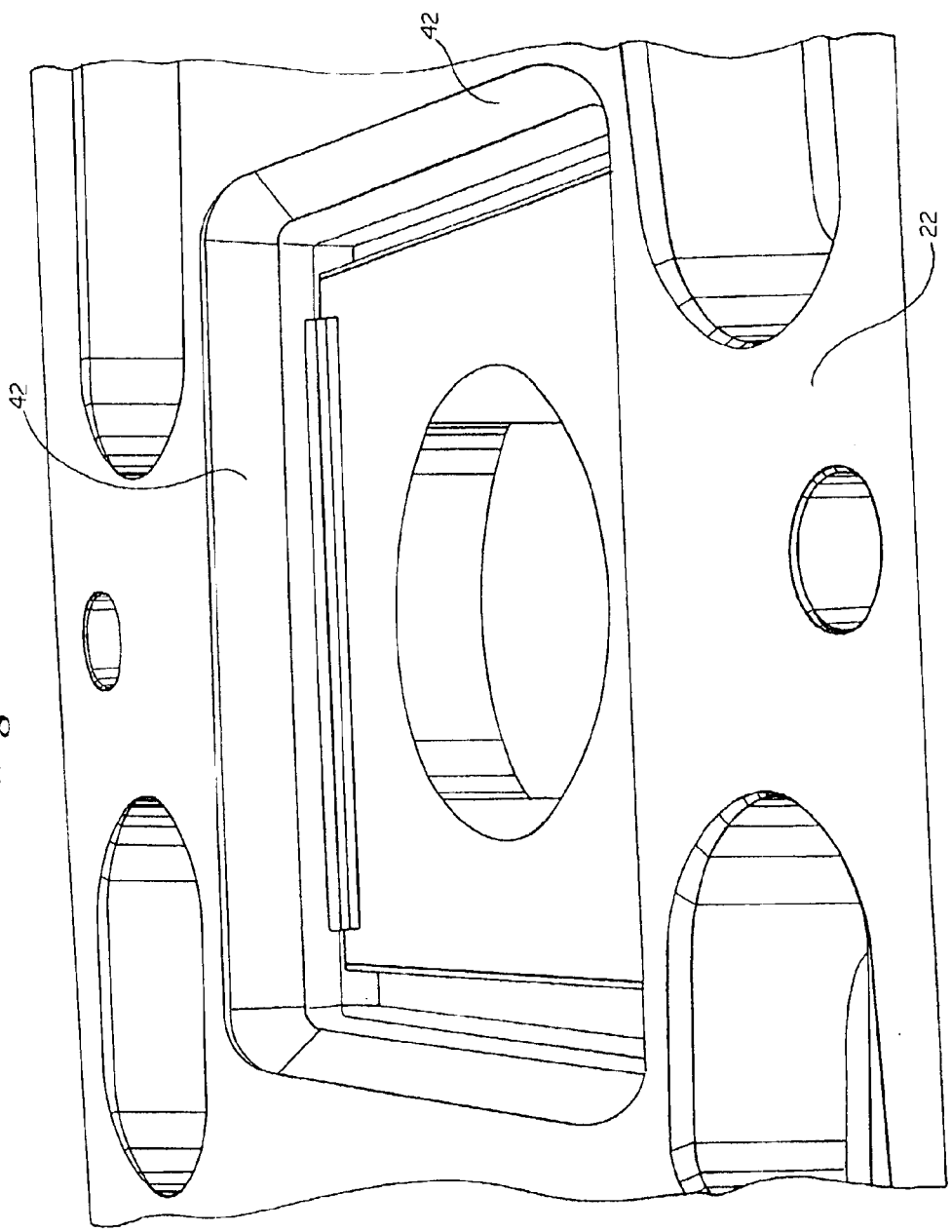
FIG. 4 illustrates an elevated side view of a supply structure.
Figure 5:
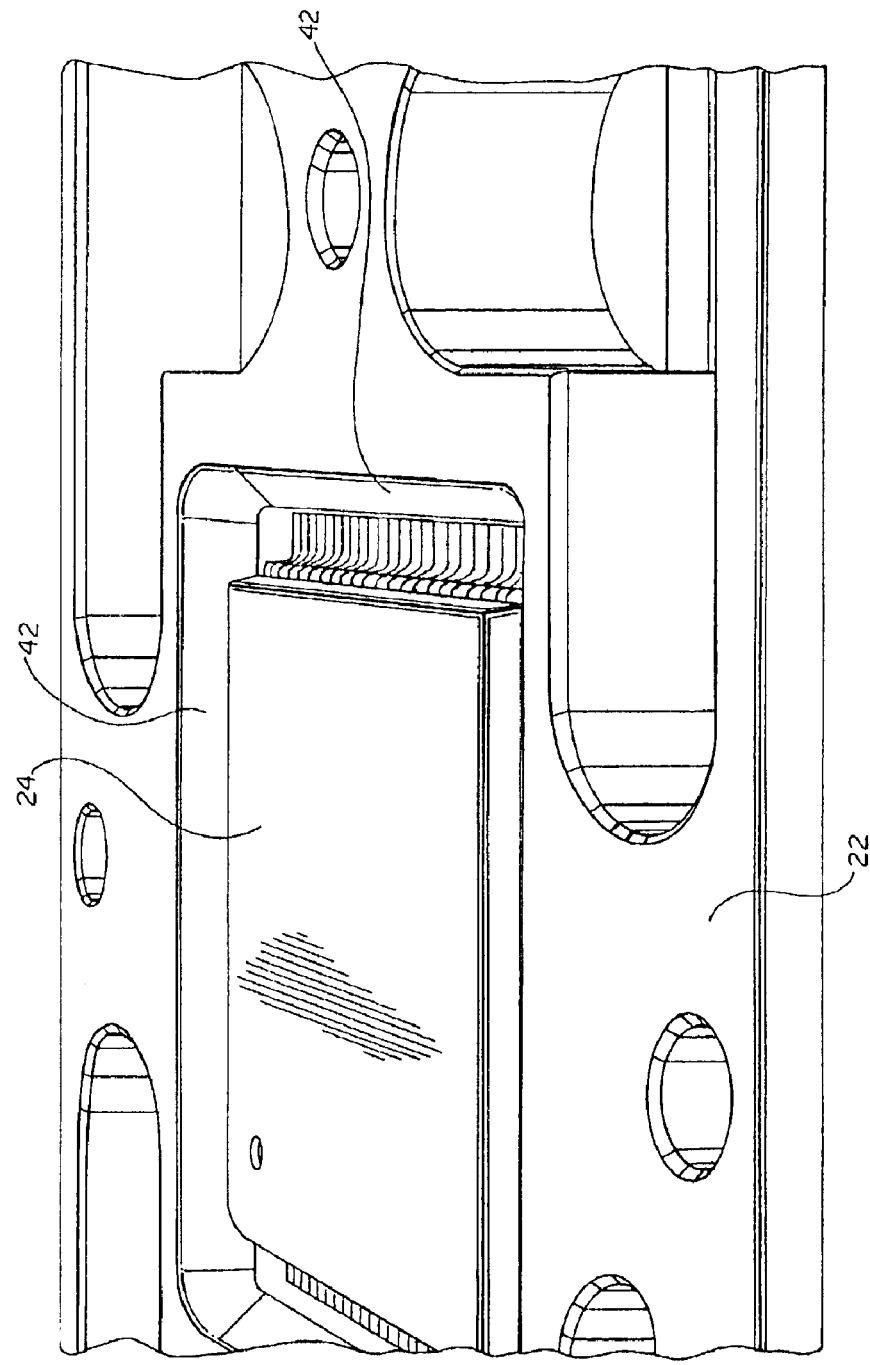
FIG. 5 illustrates an elevated side view of the supply structure housing a package therein.
Figure 6:
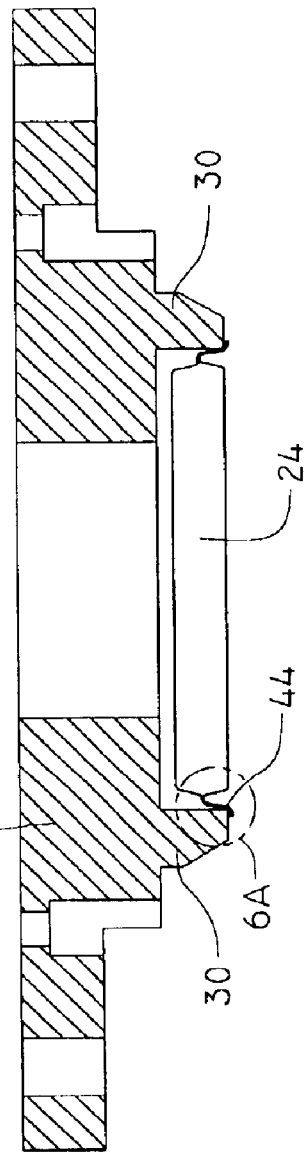
FIG. 6 illustrates a prior art device showing a nest assembly, with an IC package positioned therein.
Figure 6A:
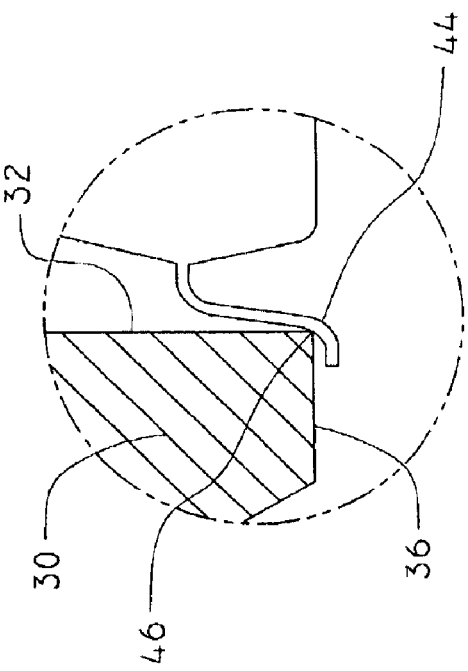
FIG. 6a illustrates a close up view 6A of FIG. 6.
Figure 16:
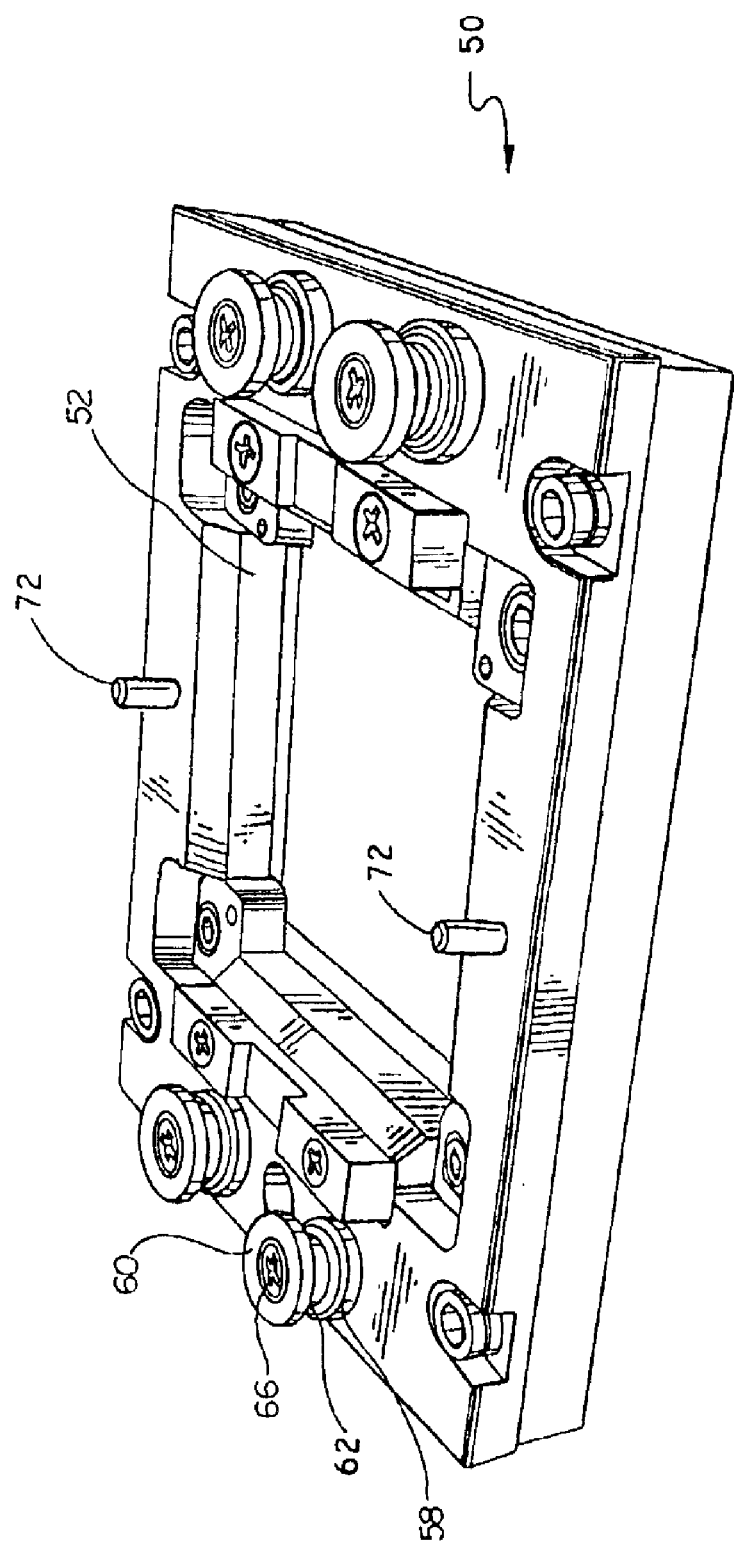
FIG. 16 illustrates an angled side view of an embodiment of the present invention showing an alignment plate for use in a receiving structure assembly.

The retainer 28 is preferably constructed and arranged to allow the nest 26 to move in X and Y dimensions and have theta rotation in the X-Y plane with respect to its interface with a receiving structure or supply structure, such as those structures shown in FIGS. 3 and 16 respectively. The retainer 26 may also be constructed and arranged to allow the nest 26 and retainer 28 to be mounted to the arm of the pick and place mechanism to form a nest assembly 20. The retainer 28 is generally constructed with an aperture sized to receive a portion of the nest 26. The retainer 28 is designed to hold the nest 26 while allowing the nest 26 movement in X and/or Y dimensions and preferably have theta rotation. For example, the embodiment shown in the figures provides movement of the nest 26 with respect to the X and Y dimensions and theta rotation with respect to a supply structure 22 or a receiving structure 50.

Figure 11:
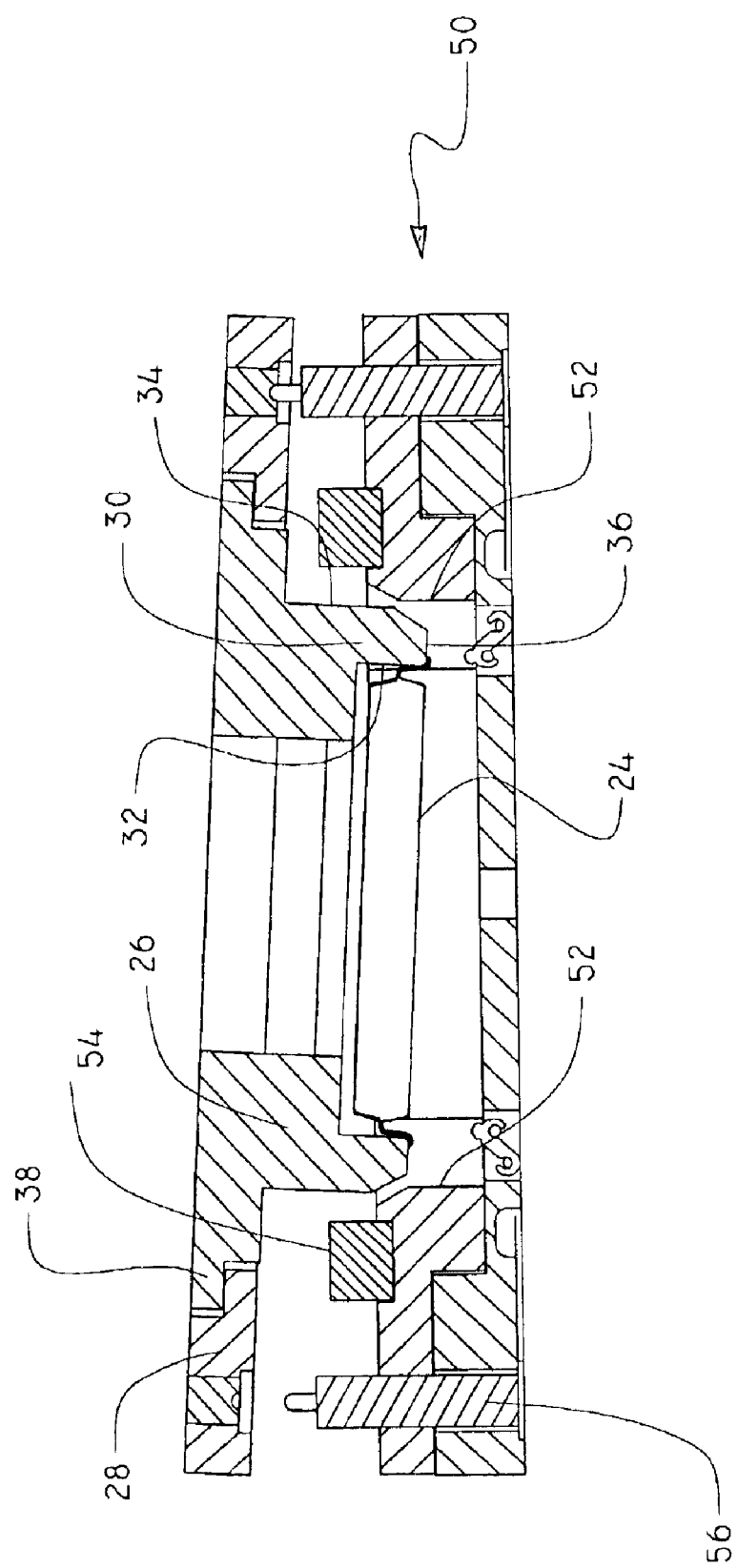
FIG. 11 illustrates side view of an embodiment of the present invention showing a nest being seated in a receiving structure assembly from an angle that is 2 degrees from parallel to the surface of the receiving structure.
Figure 12:
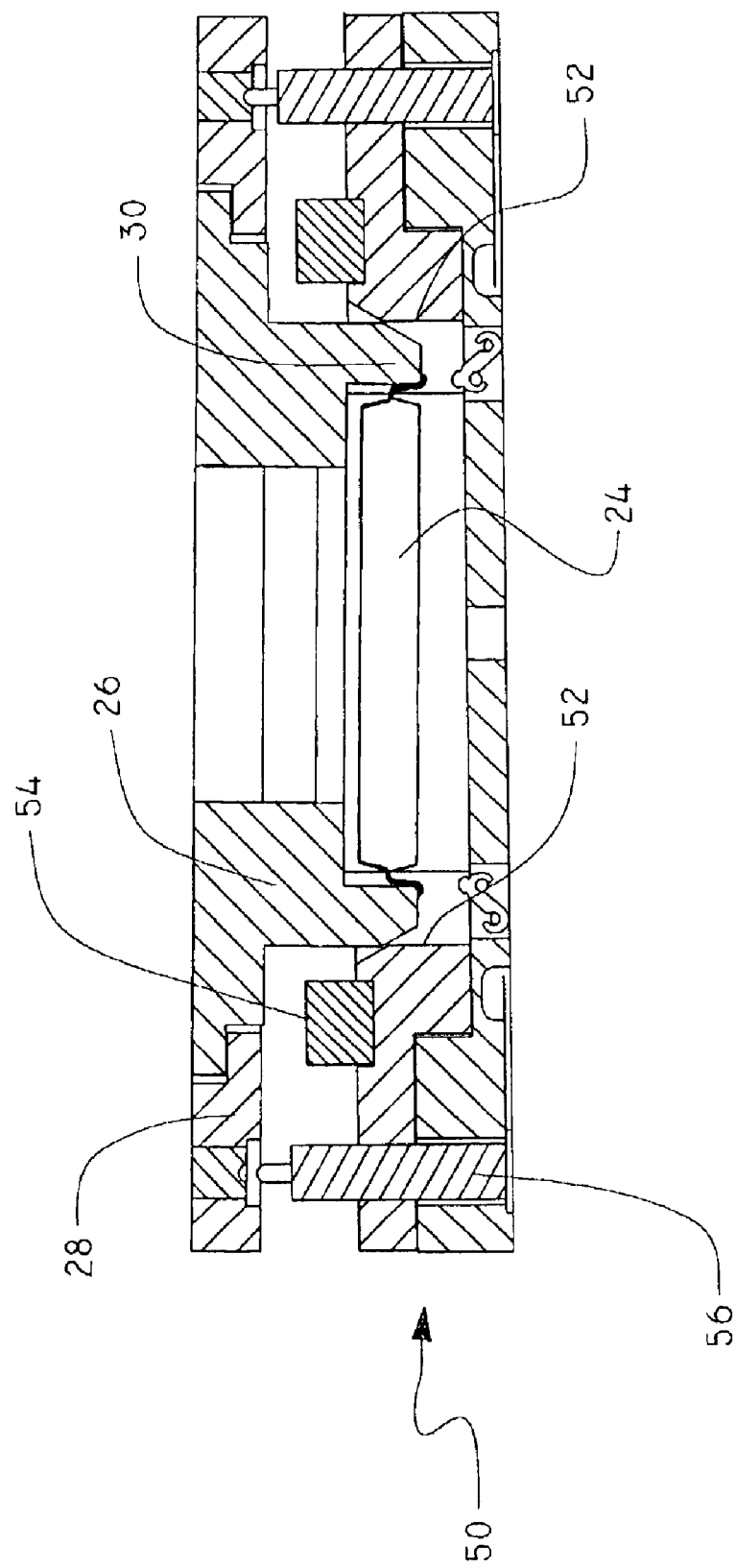
FIG. 12 illustrates an embodiment of the present invention showing a nest being seated in a receiving structure assembly from an angle that is 1 degree from parallel to the surface of the receiving structure.
Figure 13:
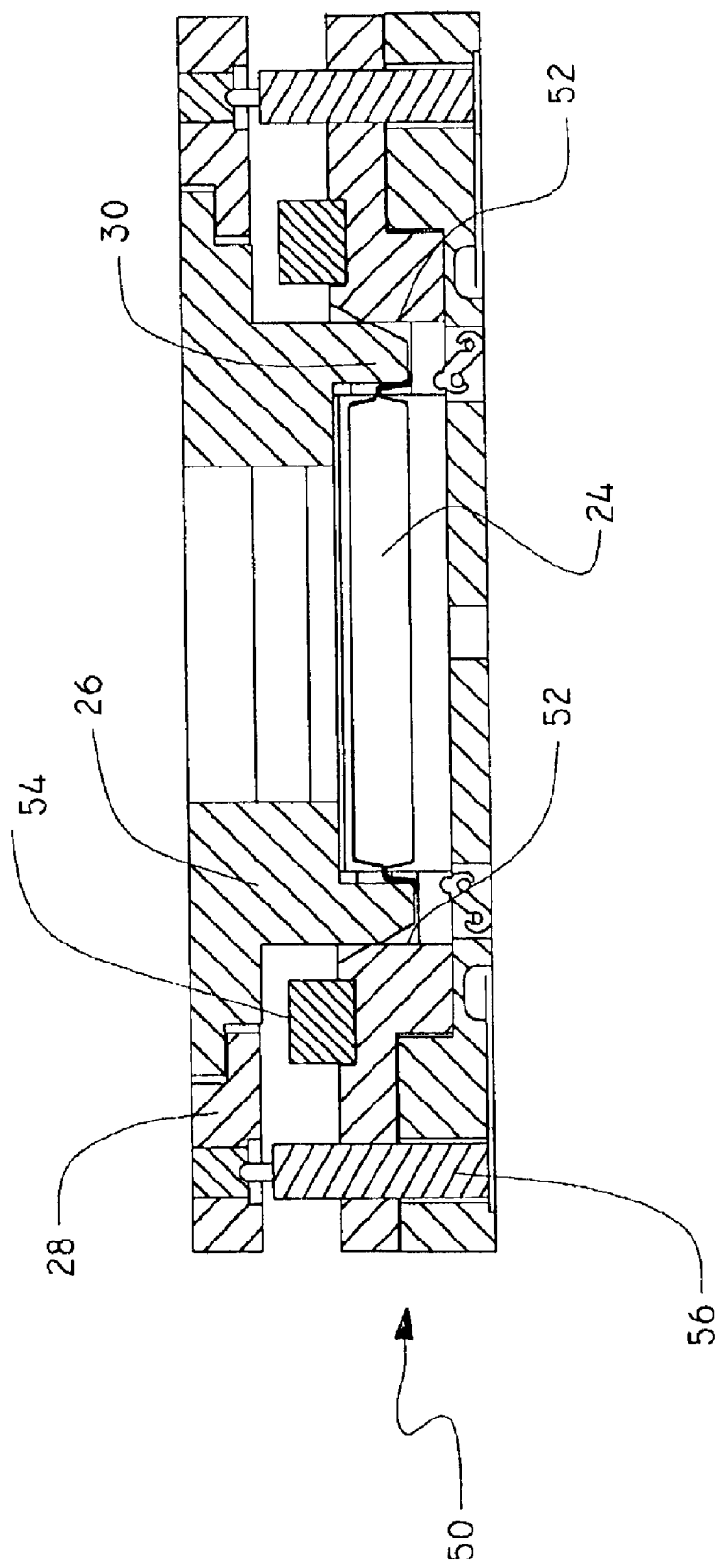
FIG. 13 illustrates an embodiment of the present invention showing a nest being seated in a receiving structure assembly from parallel to the surface of the receiving structure.
Figure 14:
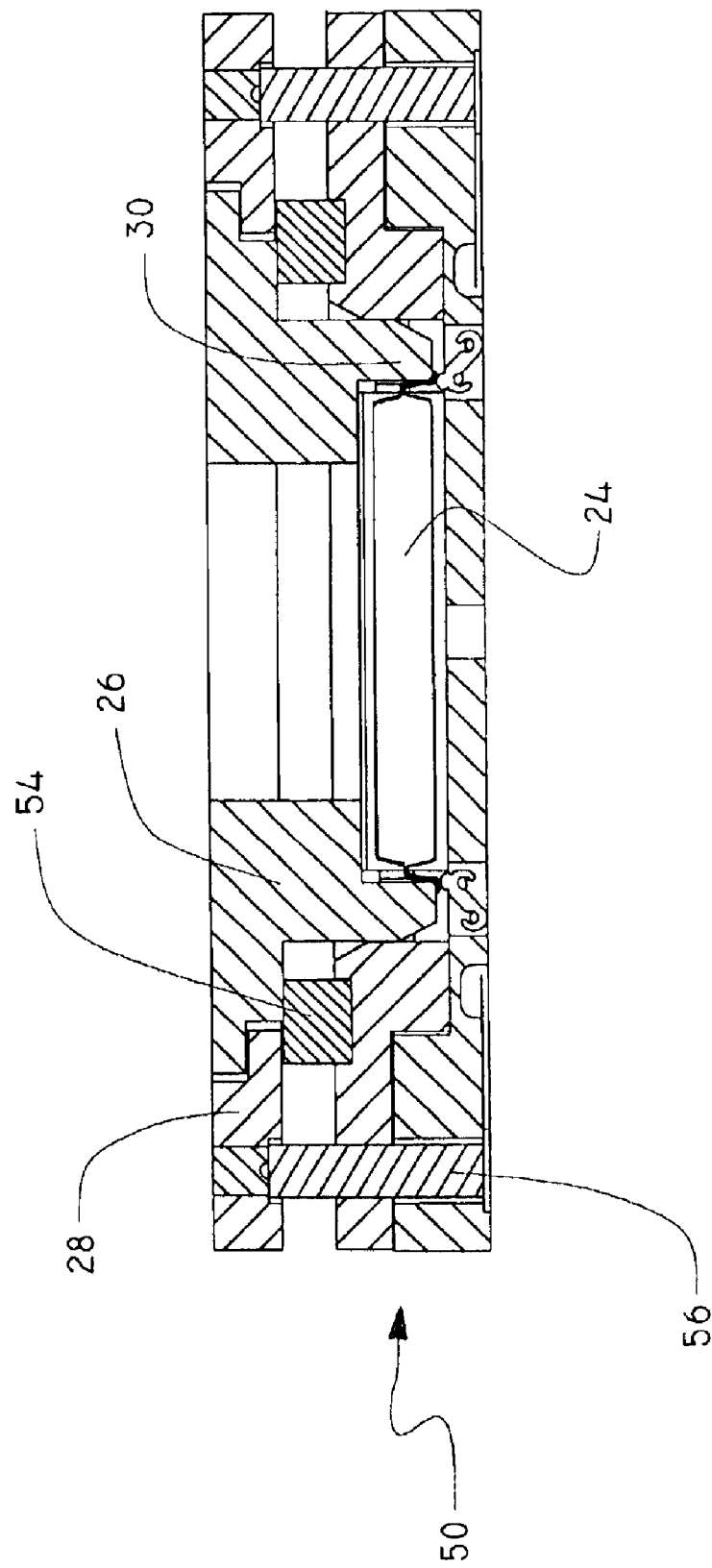
FIG. 14 illustrates an embodiment of the present invention showing a nest fully plunged in a receiving structure assembly.

Any suitable means known in the art for restricting the dimensional movement of the nest may be utilized. For example, some embodiments of the nest provide that the nest 26 has a flange 38 (FIG. 11) resting on a retainer ledge 138 (FIG. 19) that extends outward in at least one elongate dimension with respect to the aperture. The size of the flange 38 and the rest of the body of the nest 26 combined, is larger than the size of the aperture and, therefore, a portion of the nest 26 is held within the aperture. Preferably, the flange 38, 138 extends laterally around a portion or around the entire nest 26. In this embodiment, the flange 38 and the portion of the nest 26 aligned with the flange 38 may be positioned above the aperture.

Figure 2:
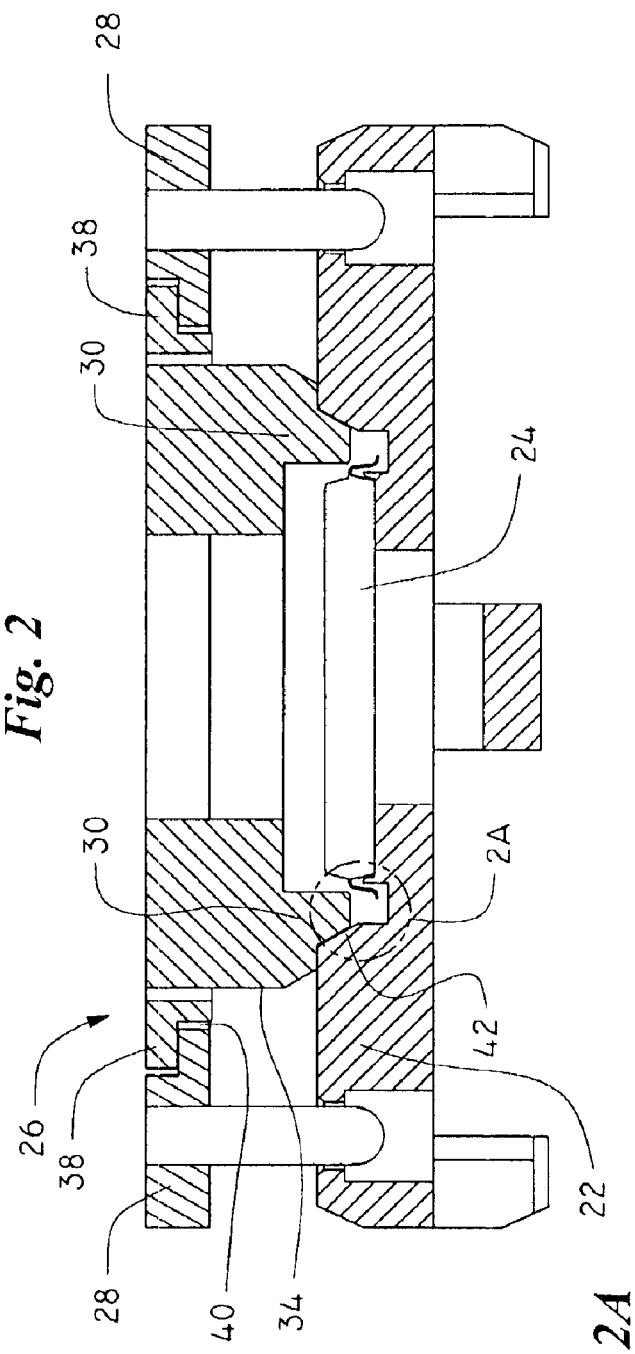
FIG. 2 illustrates an embodiment of the present invention showing a nest seated within a retainer interacting with a supply structure.
Figure 8:
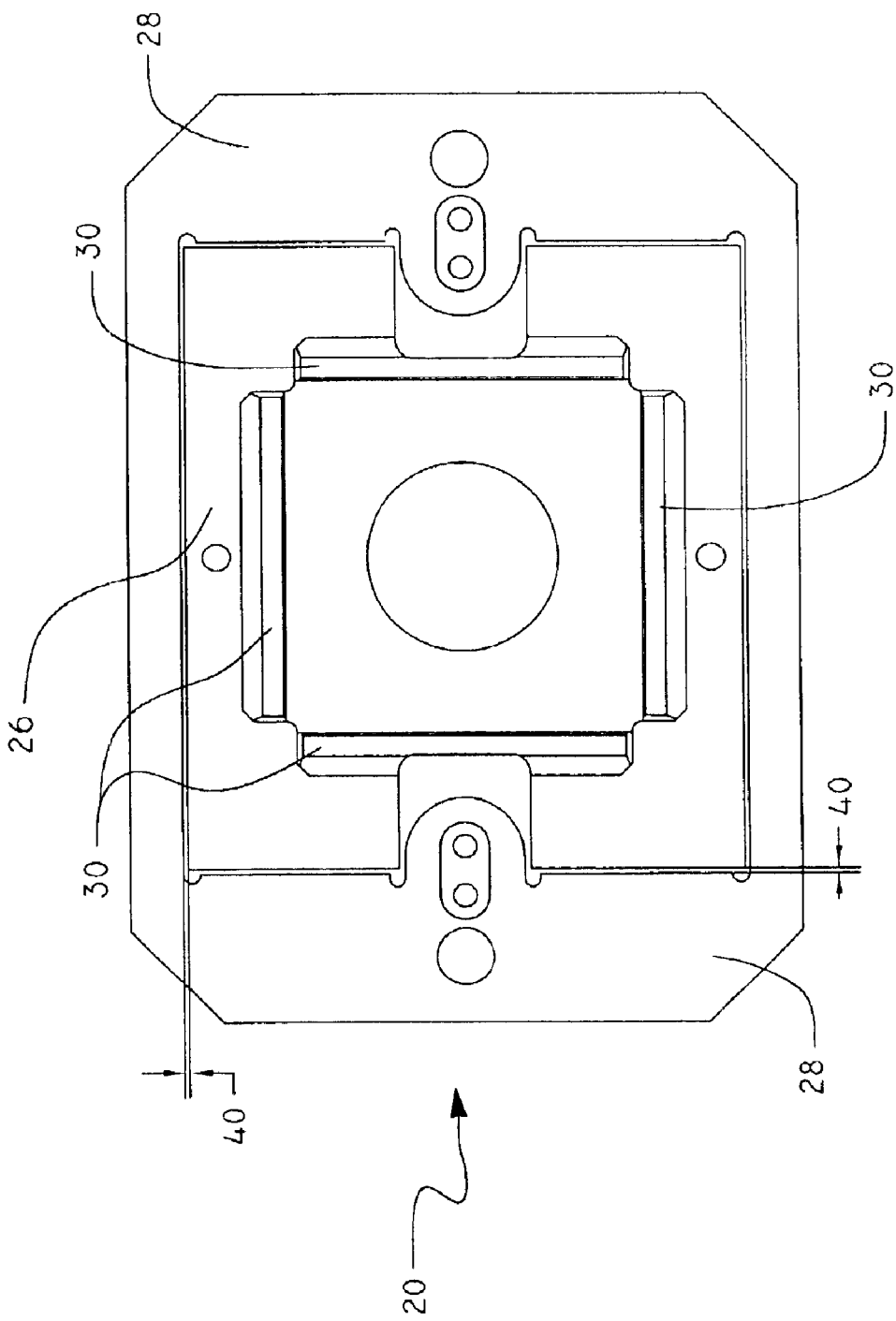
FIG. 8 illustrates an embodiment of the present invention showing a two piece assembly, a nest and a retainer.

Also with regard to this embodiment, the portion of the nest 26 that is within the aperture may be sized to be smaller than the aperture, such that there is a gap 40 between at least one side of the nest 26 and the wall forming the aperture. For example, if the nest has four sides and a gap along one side, then the nest is adjustable in one dimension. If the nest has four sides and a gap is formed on at least two adjacent sides, then the nest is adjustable in two dimensions. Additionally, as shown in FIGS. 2 and 8, the aperture of the retainer 28 may be countersunk into the surface of the retainer 28 to accommodate the flange 38, thereby allowing the mounting surfaces of the nest 26 and the retainer 28 to be flush with each other.

As shown in FIGS. 1 and 3, the supply structure 22 is a structure generally having one or more recessed interior areas, defined by a plurality of sidewalls 42, for receiving a package 24 therein. Embodiments of the present invention provide a supply structure 22 having a sidewall structure 42 that interacts with the sidewalls 30 of the nest 26 to guide the sidewalls 30 of the nest 26 into the recessed interior of the supply structure 22, thereby aligning the nest 26 with the supply structure 22. Additionally, this embodiment provides a structure for guiding the nest 26 into the supply structure 22 by means of the design of the sidewalls 30 of the nest 26 and the supply 22 and/or receiving 50 structures to contact each other and thereby adjust the position of the nest 26 as it gets closer in proximity to a supply or retaining structure. Additionally, this sidewall structure may be designed to act to position the nest vertically with respect to the contact surface, such as the test socket surface, of the supply or receiving structure.

One embodiment of the present invention provides a supply structure 22 having the interior surfaces of the sidewalls 42 angled outward from the interior such that the walls act to guide the nest assembly 20 into alignment with the supply structure 22. In this embodiment, preferably, a portion of the sidewalls 30 of the nest 26 are also angled. More preferably, the angles 48 of the sidewalls 30 of the nest 26 and the supply structure 22 are opposite angles, thereby providing a symmetrical alignment between the two angles. It is preferred that the angled portion of the sidewalls 30 of the nest 26 is provided at the interface between the exterior surface 34 and the end surface 36 of the walls. The angled structure 48 on the nest 26 may also be employed with a receiving structure 50, thereby allowing the shaped sidewalls 30 to guide the nest 26 into engagement with the receiving structure 50 to thereby allow the package 24 to be aligned with the receiving structure 50. If desired, vertical alignment may be provided. This feature may be accomplished by structures such as the interaction of the angled side surfaces 48 of the side walls 30 with the sidewalls 42 or 52, as indicated on FIG. 1, or by a stop surface 72 with the top of the supply or receiving structure or with the top of an overtravel stop structure 54 that is constructed and arranged to abut the top surface of the stop surface 72. Additionally, the receiving structure itself or alternatively an alignment plate may have the means for guiding the nest into the receiving structure.

Figure 9:
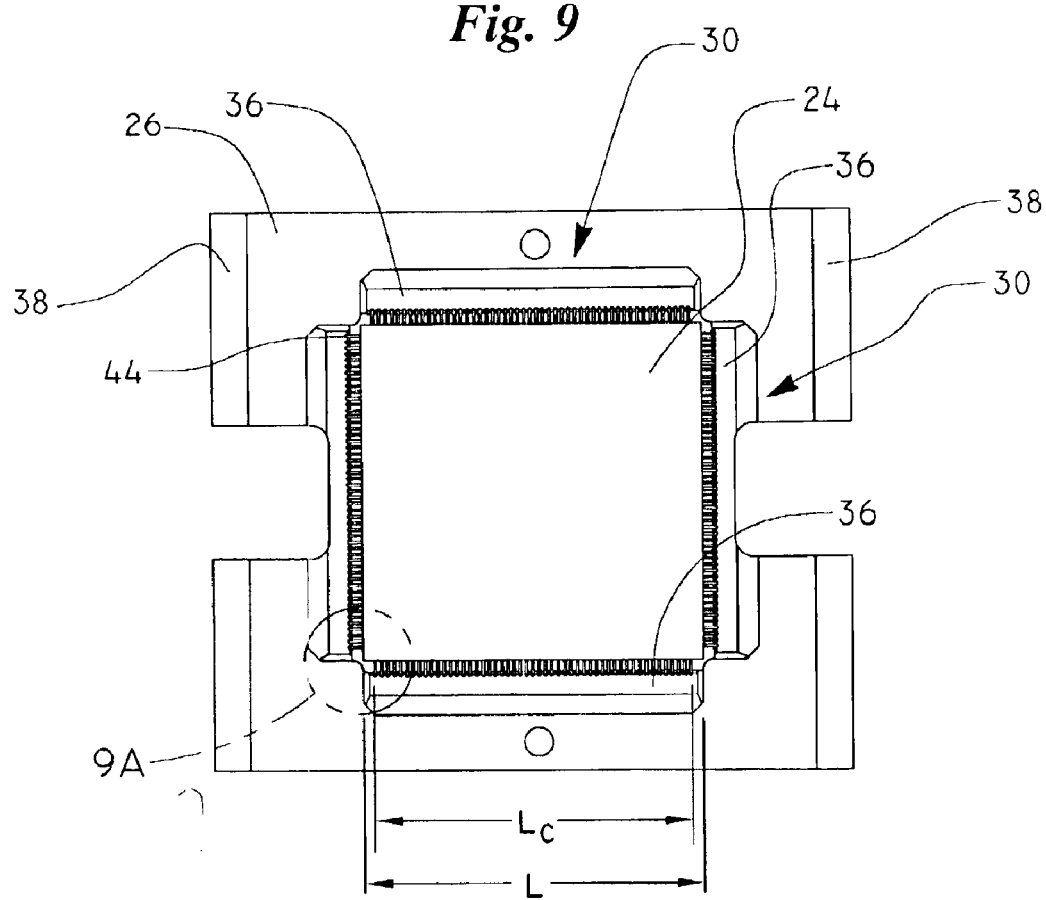
FIG. 9 illustrates a bottom view of an embodiment of the present invention showing a nest, with a package having four sets of contacts, positioned therein.
Figure 9A:
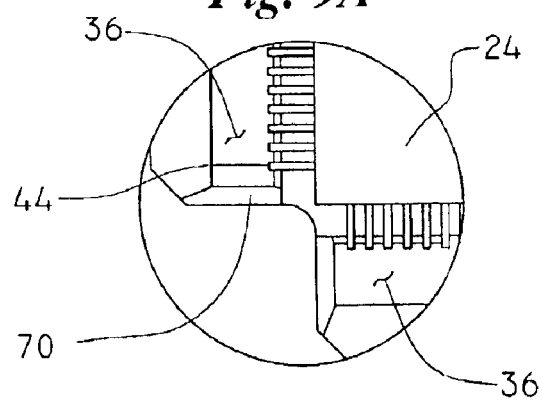
FIG. 9a illustrates a close up view 9A of FIG. 9.

The present invention may also have sidewalls 30 with angled or curved ends. For example, in FIG. 9A, the ends 70 of the sidewalls 30 are angled. This feature allows the nest to slide more easily into proper alignment with the supply and/or receiving structures.

Figure 2A:
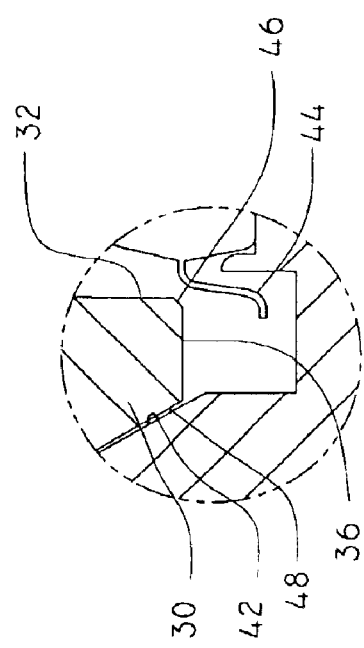
FIG. 2a illustrates a close up view 2A of FIG. 2.

Another aspect of the present invention is the interaction between the surface of the nest 26 and the contact leads 44 of the package 24. Many packages utilize leads 44, wherein at least a portion of the lead 44 is angled outward with respect to the center of the package 24. The present invention is constructed and arranged to provide a surface that generally conforms to the outwardly angled portion of the package leads. In one embodiment, shown in FIGS. 2, 2A, 7, and 7A, the interface between the interior surface 32, and the end surface 36 of the sidewalls 30 of the nest 26 is angled. The interface may also be curved. The interface is preferably, generally a planar angled surface 46, as shown in FIG. 2A. This feature can provide a tighter fit between the nest 26 and the IC package 24 because the interior walls 32 may be moved inward. Additionally, this feature also increases the surface area in contact with the IC package 24 and can therefore, increase control of the movement of the package 24 and reduce wear upon the corners of the nest 26. Furthermore, this feature moves one contact point between the leads 44 and the nest 26 closer to the attachment point of the leads 44 to the package 24 as FIG. 7A shows. At this closer point, the tendency of the lead to bend or break is less and, therefore, there is less of a tendency for the IC package to be damaged. A second contact point of sidewall 30 closer to the end of lead 44 can also be seen in FIG. 7A.

Figure 18:
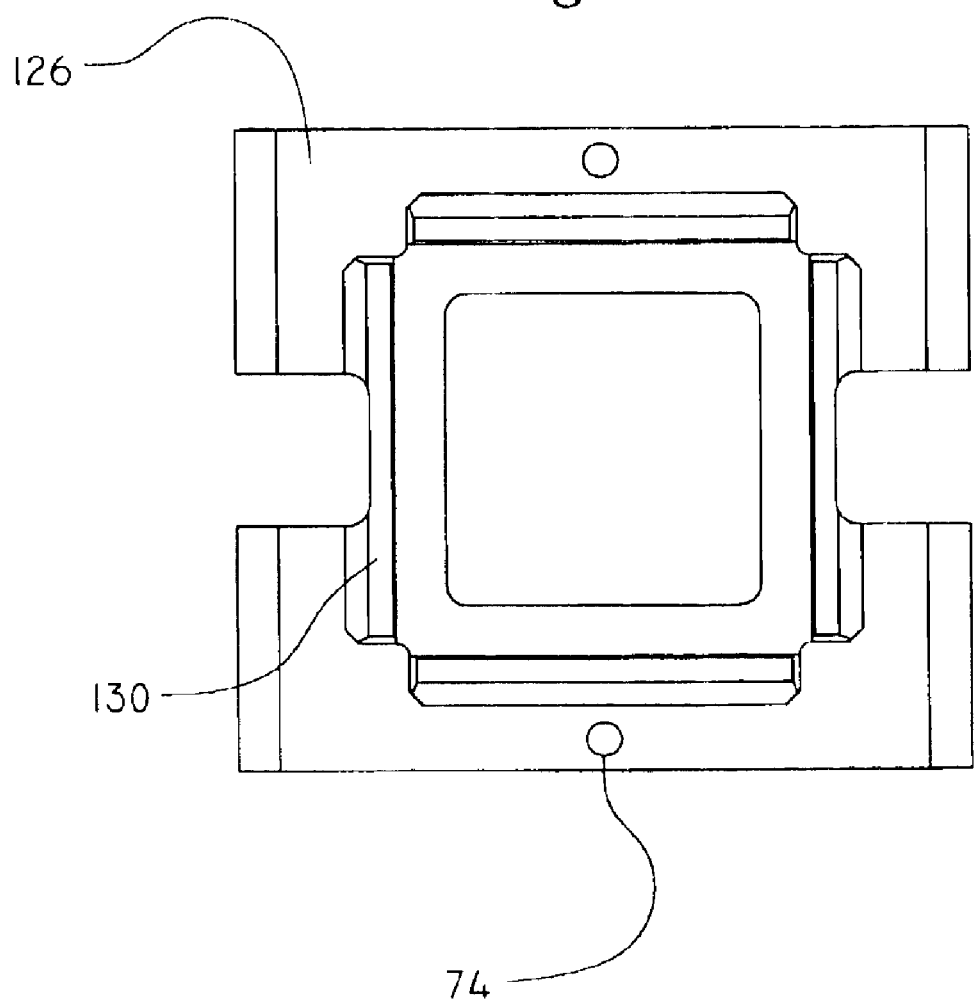
FIG. 18 illustrates a bottom view of an embodiment of a nest constructed according to the present invention.
Figure 19:
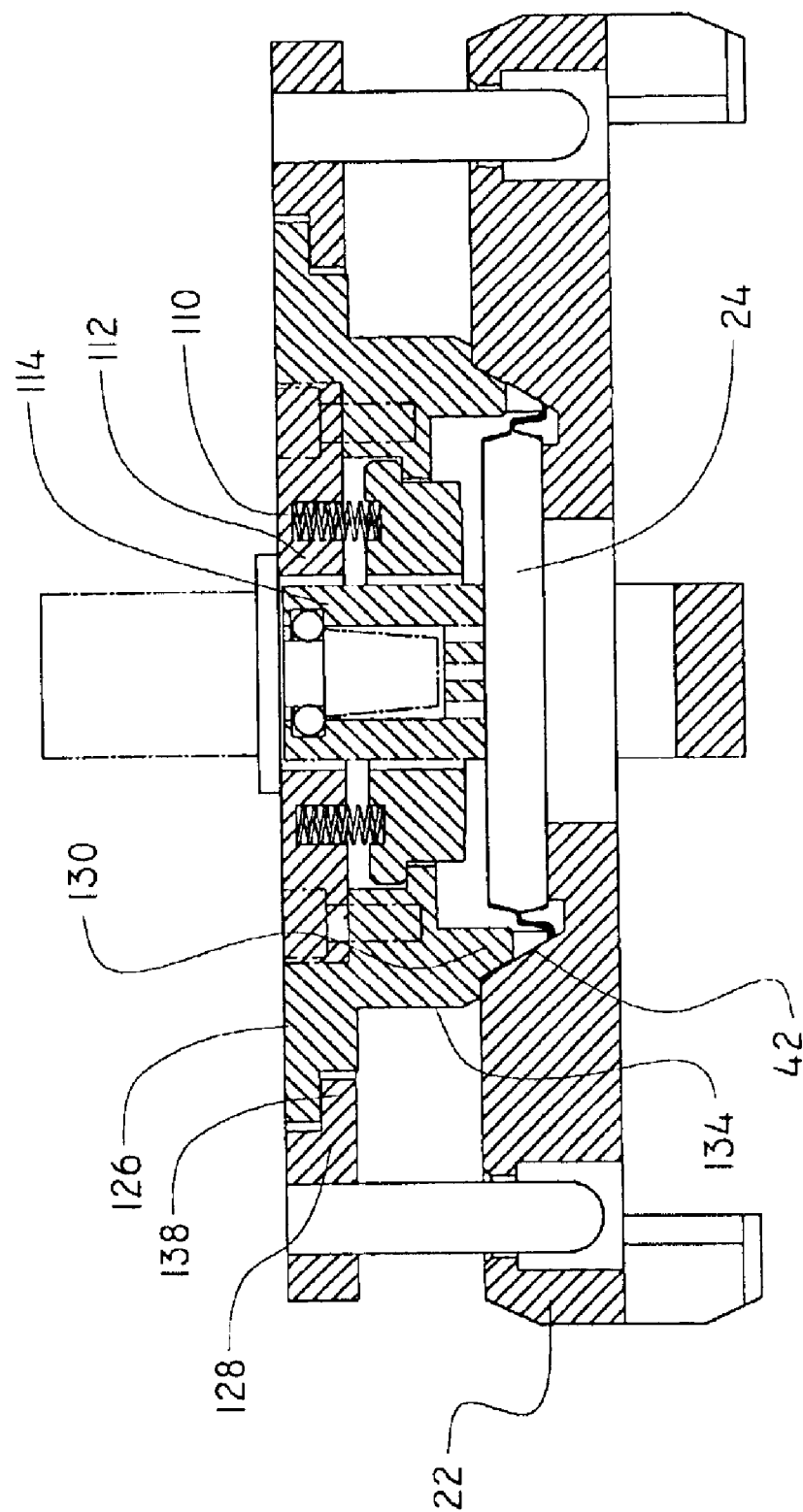
FIG. 19 illustrates a side view of an embodiment of a nest, with a thermal retaining mechanism, engaged with a supply structure and constructed according to the present invention.
Figure 20:
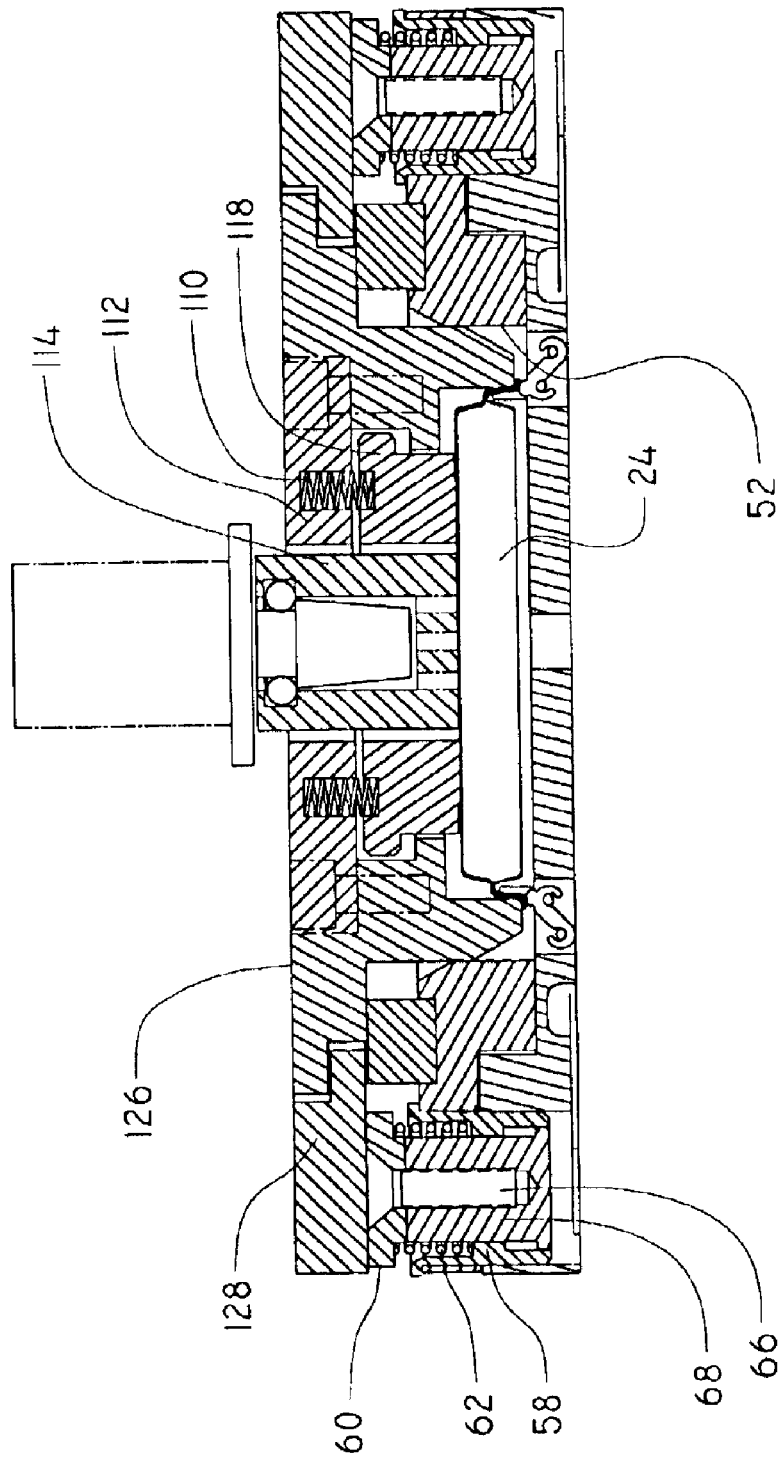
FIG. 20 illustrates a side view of an embodiment of a nest, with a thermal retaining mechanism, fully seated in a receiving structure assembly and constructed according to the present invention.
Figure 22:
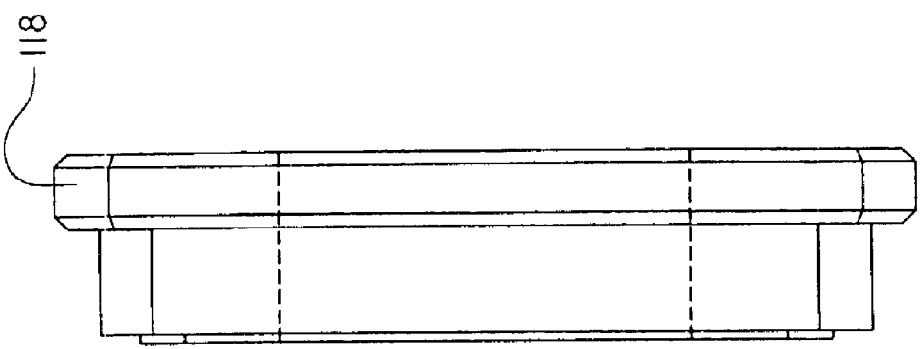
FIG. 22 illustrates a side view of a thermal retaining mechanism of FIG. 21.
Figure 21:
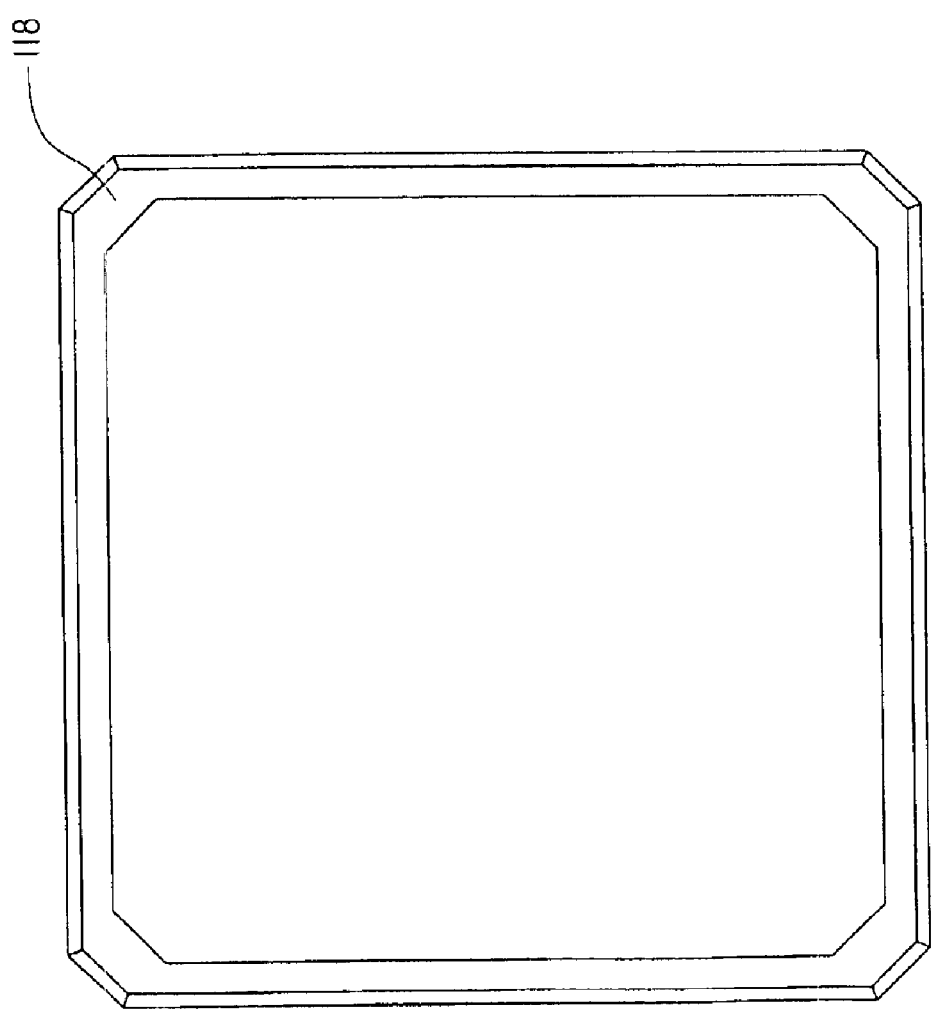
FIG. 21 illustrates a bottom view of a thermal retaining mechanism.

The present invention also provides an interface system having a nest assembly apparatus with a means for retaining temperature of the package in order to retain its temperature prior to, during, and/or after a test. The thermal retaining mechanism may provide a heating or cooling source to the nest 126 and may be heated or cooled by the temperature surrounding the mechanism or have a temperature creating source attached thereto. In one embodiment, as shown in FIGS. 18–19, the nest is at least partially formed from a thermally conductive material. The portion formed from this material is preferably adjacent to or abutted against the surface of the package 24. The temperature conductive material may be bonded or affixed by other means to the non-conductive portion of the nest 126. Additionally, as shown in FIGS. 19 and 20, temperature conductive portion 118 may be mounted to the nest 126 by a plurality of resilient mechanisms 110. It is preferred that the force applied by the resilient mechanisms 110 be sufficient to keep the surface of the conductive material 118 in contact with the package 24, but not large enough to provide the primary force to press the package 24 into the receiving structure 50. Any number and suitable type of resilient mechanisms 110, may be utilized, including elastomeric materials and mechanical structures, such as springs and the like. For example, four coil springs may be used. Furthermore, a temperature conducting vacuum cup 114 may be utilized either separately or in combination with a second thermal retaining mechanism, such as element 118, and/or the nest partially constructed of conductive material, as shown in FIGS. 18 and 19. In the embodiment shown, the nest portion 112 is preferably formed from a non-conductive material. The conductive portions of the elements may be made from any suitable material. For example, aluminum, stainless steel, and Torlon are three suitable examples.

Receiving structures 50 of the present invention shown in FIGS. 11–17 may have a recessed interior portion defined by a plurality of sidewalls 52. In receiving structures utilized as test sockets, the testing socket itself is housed within the recessed interior of the structure. Embodiments of the present invention utilize the sidewalls 52 forming the recessed interior to guide the package 24 to be tested into a receiving structure 50. Similar to that of the supply structure 22, the present invention provides a receiving structure 50 generally having means for guiding the sidewalls 30 of the nest assembly 20 into the recessed interior of the receiving structure 50, thereby aligning the nest 26 with the receiving structure 50.

For example, one embodiment of the present invention provides a receiving structure having the interior surfaces 52 of the sidewalls angled outward from the interior such that it acts to guide the nest 26 into alignment with the receiving structure 50. In this embodiment, preferably, a portion of the sidewalls 30 of the nest 26 are also angled and, more preferably, the angles 48 of the sidewalls 30 of the nest 26 and the receiving structure 50 are opposite angles, thereby providing a symmetrical alignment between the two angles. It is preferred that the angled portion of the sidewalls 30 of the nest 26 are provided at the interface between the exterior surface 34 and the end surface 36 of the walls 30.

The present invention also provides a receiving structure 50 that restricts overtravel of the nest assembly 20. Any means known in the art for providing the restriction of overtravel may be utilized. One such example is to affix an overtravel structure 54, such as a block of rigid or elastomeric material to the top surface of the receiving structure 50. In this example, the overtravel structure 54 is constructed and arranged to contact a surface of the nest assembly 20 and, therefore, restrict the nest assembly's further movement toward the receiving structure 50. Preferably, the overtravel means is adjustable allowing the amount of travel to be adjusted to particular applications. The overtravel structure may also be removable and/or replaceable.

The receiving structure 50 may also be constructed having two or more anti-rotation pins or apertures for aligning the nest 26 with the structure and thereby reducing the amount of rotation of the nest 26 with respect to the structure 50. As shown in FIGS. 15–18, the receiving structure 50 may have two or more pins 72 mounted thereon that are constructed and arranged to mate with apertures 74 formed in the body of the nest assembly 26, as shown in FIG. 18.

Figure 17:
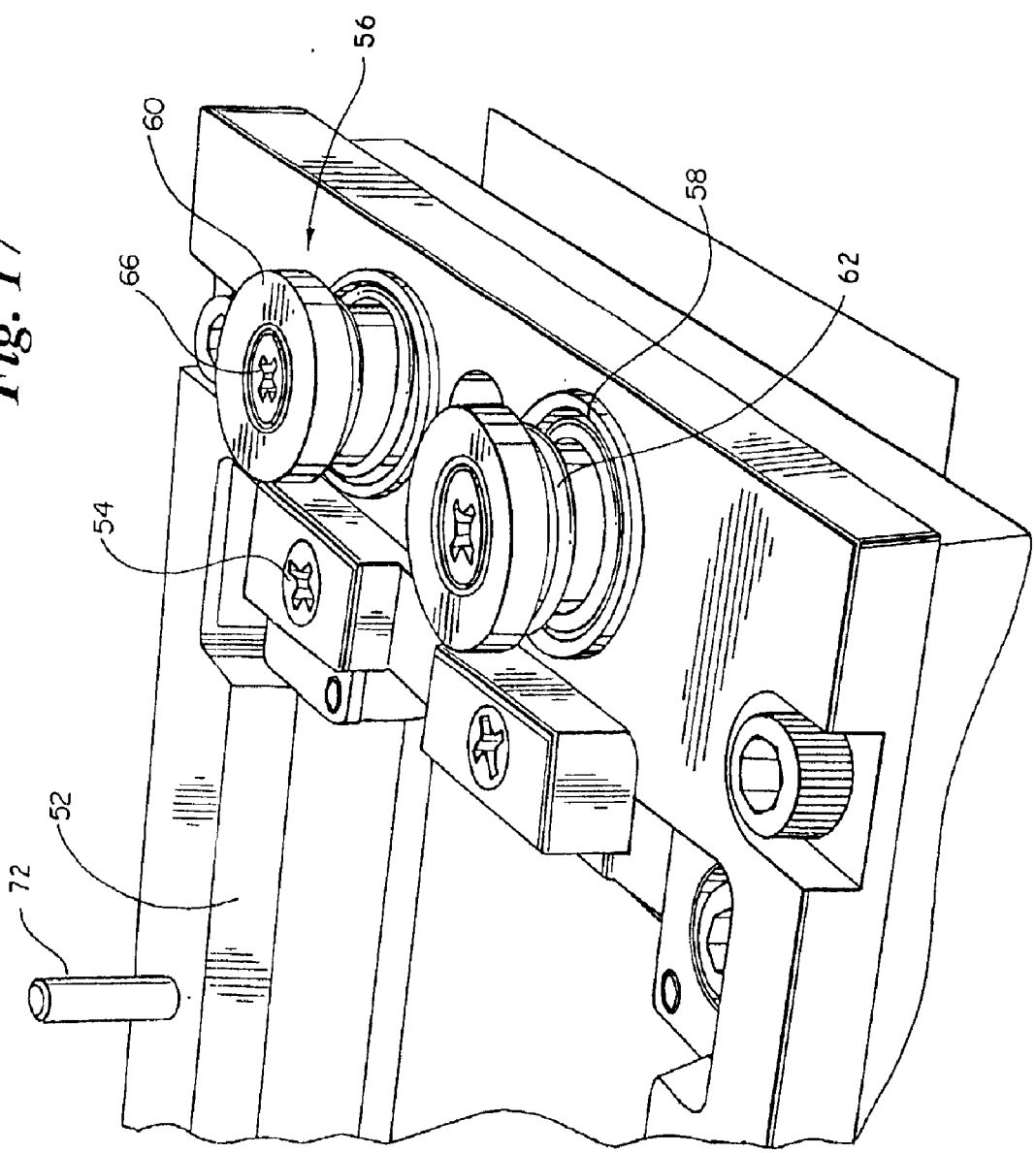
FIG. 17 illustrates a close up angled side view of an embodiment of the present invention showing spring mechanisms of an alignment plate for use in a receiving structure assembly.

The present invention also has means for cushioning the engagement between the nest assembly 20 and the receiving structure 50. The cushioning means may be provided by any suitable means known in the art such as spring mechanisms or elastomeric materials. For example, one or more spring mechanisms 56 may be employed between the nest assembly 20 and the receiving structure 50 to cushion the engagement between the assembly and structure. Preferably, the spring structures 56 in this embodiment are comprised as shown in FIGS. 16 and 17. In particular, the spring mechanisms 56 are formed in a canister design, having a hollow cylinder as a body 58 and a top 60 having a generally planar surface. The top 60 is movably affixed to the body 58 and a coil spring 62 is positioned within the body 58 providing a force to separate the top 60 from the body 58. The affixation of the top to the body may be by any means known in the art. For example, a screw 66 may be affixed into a hole in the body 58 such that the length of the screw maintains the top 60 at a maximum distance to the body 58 and the contact of the top 60 with the body 58 provides the minimum travel distance for the spring mechanism 56. This assembly could also be utilized as the overtravel stop mechanism between the nest assembly 20 and the receiving structure 50.

Figure 15:
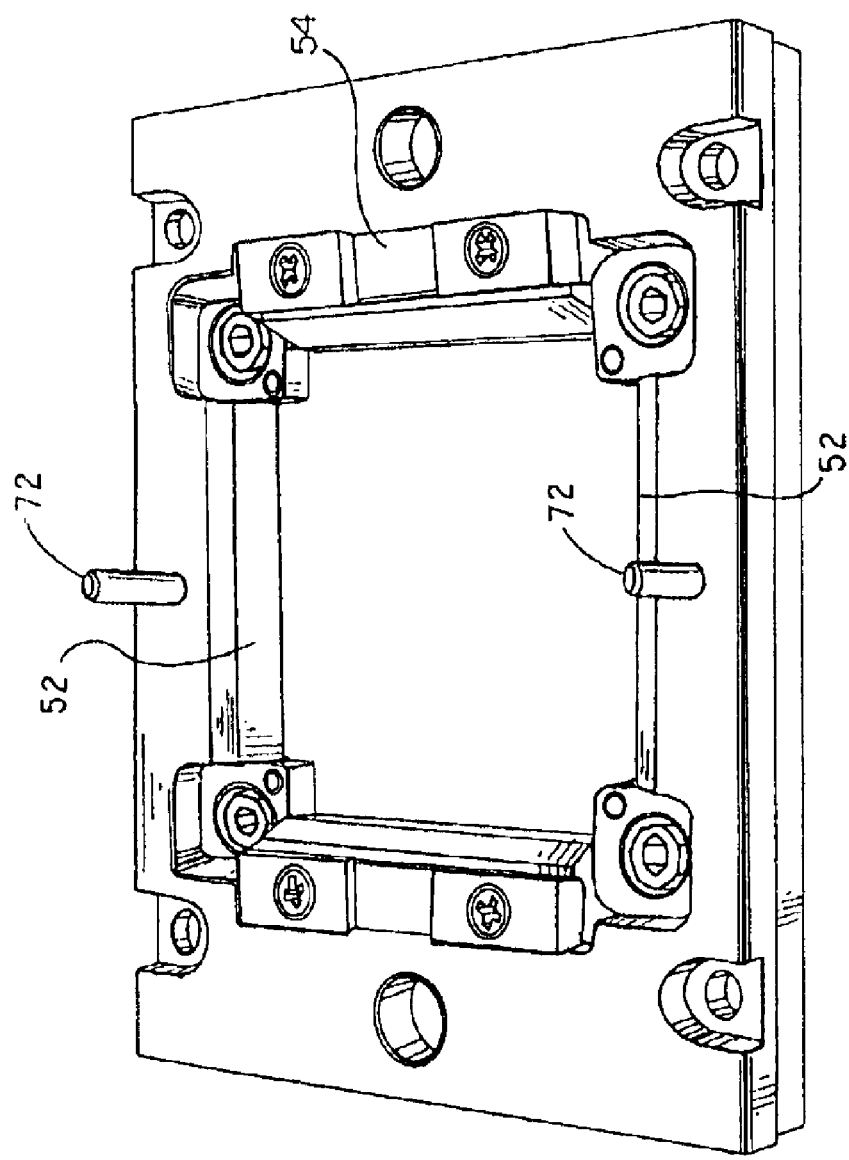
FIG. 15 illustrates an angled top view of an embodiment of the present invention showing an alignment plate for use in a receiving structure assembly.

The receiving structures 50 of the present invention may also utilize an alignment plate assembly, wherein an alignment plate is mounted over a traditional receiving structure, such as a test socket. For example, as shown in FIGS. 15–17, an alignment plate may placed over the traditional receiving structure and may be equipped with one or more of the features disclosed in the above description of the receiving structures. Specifically, the alignment plate may have one or more over travel stop structures, one or more cushioning means, and/or shaped sidewalls that provide guidance to the nest assembly, such as straight or angled or curved, for example. The alignment plate may be affixed to the traditional receiving structures by any suitable means known in the art, for example, screws, bolts, glue, and the like. In this embodiment, an alignment plate may be utilized to update a receiving structure that is already in use, but does not have one or more of the features disclosed herein.

Although the present invention has been described with reference to preferred embodiments, workers skilled in the art will recognize that changes may be made in form and detail without departing from the spirit and scope of the invention. Additionally, since many possible embodiments may be made of the present invention without departing from the scope thereof, it is to be understood that all matter herein set forth or shown in the accompanying drawings is to be interpreted in the illustrative and not a limiting sense. Additionally, use of terms such as "top" and "side" are merely to facilitate understanding of the embodiment shown and should not be deemed limiting upon the present invention.

That which is claimed is:

1. An interface system for reception and delivery of a package having a plurality of leads from a first location to a test socket at a second location, said test socket having a plurality of contacts for electrical connection with corresponding leads on the package, comprising:

a nest assembly transporting the package;

an alignment plate affixed to said test socket said alignment plate having means for aligning the nest assembly with said test socket, and the package's leads with corresponding test socket contacts; and a spring assembly mounted on the alignment plate and having means for providing a resilient force between the nest assembly and the alignment plate and means for restricting the movement of the nest assembly thereby restricting the distance between said nest assembly and said alignment plate at both a minimum distance and a maximum distance, wherein said spring assembly comprises a cylinder having a hollow interior holding said means for providing force between the nest assembly and the alignment plate, and wherein said movement restricting means further includes a minimum restricting structure and a maximum restricting structure.

* * * * *